United States Patent
Yajima

(10) Patent No.: US 6,204,150 B1
(45) Date of Patent: *Mar. 20, 2001

(54) SEMICONDUCTOR DEVICE AND METHOD OF MANUFACTURING SEMICONDUCTOR DEVICE WHEREIN FIELD OXIDE IS PROTECTED FROM OVERETCHING

(75) Inventor: Tsukasa Yajima, Minato-ku (JP)

(73) Assignee: Oki Electric Industry Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/038,749

(22) Filed: Mar. 12, 1998

(30) Foreign Application Priority Data

Jul. 31, 1997 (JP) ................................. 9-206591

(51) Int. Cl.⁷ ....................................... H01L 21/76
(52) U.S. Cl. ............................... 438/448; 438/225
(58) Field of Search ....................... 438/439, 448, 438/443, 225

(56) References Cited

U.S. PATENT DOCUMENTS 5,728,622 * 3/1998 Yu ............................. 438/443
5,756,390 * 5/1998 Juengling et al. .............. 438/439
5,851,901 * 12/1998 Gardner et al. ................ 438/439
5,927,992 * 7/1999 Hodges et al. ................. 438/439

* cited by examiner

Primary Examiner—Olik Chaudhuri
Assistant Examiner—Anh Duy Mai
(74) Attorney, Agent, or Firm—Jones Volentine, L.L.C.

(57) ABSTRACT

A manufacturing method that is capable of easily manufacturing a semiconductor device exhibits high reliability with no decrease in field isolation voltage from overetching. A field oxide is formed on a silicon substrate by a LOCOS method and a silicon nitride layer is then formed on the field oxide. Polysilicon is deposited on the surface of the field oxide and on the surface of a silicon nitride layer. The polysilicon layer is deposited thicker than a thickness of the silicon nitride layer. The polysilicon layer deposited on the silicon nitride layer and on the field oxide is removed by a polishing CMP method or the like, whereby the surface of the silicon nitride layer is exposed. A structure having the polysilicon layer existing on only the surface of the field oxide is then obtained by removing the silicon nitride layer. The polysilicon layer functions as a protective layer for the field oxide, thereby preventing the field oxide layer from being etched during overetching.

10 Claims, 3 Drawing Sheets

SEMICONDUCTOR DEVICE AND METHOD OF MANUFACTURING SEMICONDUCTOR DEVICE WHEREIN FIELD OXIDE IS PROTECTED FROM OVERETCHING

BACKGROUND OF THE INVENTION

1. Field of the Invention

The present invention relates to a semiconductor device including a silicon substrate formed with a field oxide for device isolation, and to a manufacturing method thereof.

2. Description of the Related Art

An LSI is formed by disposing a multiplicity of devices on a silicon substrate, and hence each individual device is electrically separated by a field oxide. The field oxide, which has a thickness on the order of several hundred nm to 1 $\mu$m, is obtained by selectively oxidizing silicon in a region between the devices on the silicon substrate.

FIG. 2 is a diagram showing processes of a method of manufacturing a MOSFET (Metal-Oxide-Semiconductor Field Effect Transistor). Referring to FIG. 2, the prior art of the method of manufacturing the semiconductor device will hereinafter be described.

To start with, a silicon oxide layer 32, which is 15–20 nm in thickness, is formed by thermal oxidation on a single crystal silicon substrate 31. A silicon nitride layer 33 is deposited in thickness of 400–600 nm on the silicon oxide layer 32 (FIG. 2(a)). Thereafter, a surface of the silicon substrate 31 under the silicon oxide layer 32 is exposed by selective etching of the silicon oxide layer 32 and the silicon nitride layer 33 by use of a resist mask (FIG. 2(b)). Then, an ion implantation is carried out to prevent a parasitic transistor from being formed, and thereafter the silicon substrate 31 is oxidized in an atmosphere containing water at approximately 1000° C. (FIG. 2(C)). At this time, the silicon nitride layer 33 functions as a mask to protect the silicon substrate from permeations of oxygen and water vapor, and therefore the exposed region of the silicon substrate by the etching can be selectively oxidized. Further, the silicon oxide layer 32 formed on the silicon substrate 31 is provided for relieving a stress produced due to a difference in terms of a thermal expansion coefficient between the selectively oxidized silicon and the silicon nitride layer 33. A process of thus oxidizing the surface of the silicon substrate is known as a LOCOS (Local Oxidation Of Silicon) method. Thereafter, the silicon oxide layer 32 and the silicon nitride layer 33 are removed, thereby completing the device separation (FIG. 2(d)).

The silicon oxide layer (hereinafter termed a field oxide layer) 34 formed by the LOCOS method is approximately 1 $\mu$m in thickness, which is approximately twice the thickness of the silicon before oxidation. Accordingly, as shown in FIG. 2(d), a region formed with the field oxide layer 34 is higher by one step than the surface of the silicon substrate 31.

Next, a gate 35 is prepared by forming a gate oxide layer 35a, a polysilicon (polycrystalline silicon) gate 35b for a gate electrode, and a tungsten silicide 35c. Then, the ions are implanted into the silicon substrate 31 to form a source/drain region. Subsequently, an oxide layer 36 of PSG (Phosphorous-Silicate-Glass) is deposited by a CVD (Chemical Vapor Deposition) method in a thickness enough to obtain a sidewall length in order to form sidewalls (FIG. 2(e)). Thereafter, the oxide layer 36 is etched by an anisotropic etching process such as RIE (Reactive Ion Etching), thereby sidewalls 37 are formed (FIG. 2(f)). At this time, there must be non-uniformities in the thickness of the oxide layer 36 deposited by the CVD method as well as in an etching speed of the anisotropic etching process, and hence an overetching process must be executed to completely remove the oxide layer 36 on the gate 35 as well as on the silicon substrate 31.

Then, the ion implantation is again implemented to form the source/drain region, and the MOSFET is completed by forming an insulating layer and a contact hole and providing aluminum wiring in normal processes.

According to the prior art method of manufacturing the semiconductor device, as discussed above, the overetching process is executed when forming the sidewall 37. Therefore, simultaneously when the oxide layer 36 is etched, the field oxide layer 34 is likewise etched and thereby reduced in thickness. Accordingly, a field isolation voltage of the field oxide layer 34 decreases, and an inter-device leakage current is increased.

Such being the case, according to the technique disclosed in Japanese Patent Laid-Open Publication No.4-100243, as shown in FIG. 3, the field oxide 34 is formed on the silicon substrate 31 by use of the LOCOS method, and, after forming a gate oxide layer 40 by thermal oxidation, the surface of the gate oxide layer 40 is further nitrided, whereby a nitride oxide layer 42 is formed on the surface of the gate oxide layer 40. Then, a gate 35 and a side-wall 37 are formed on this nitride oxide layer 42.

Thus, the nitride oxide layer 42 is formed as a protective layer on the field oxide layer 34, thereby making it feasible to prevent the field oxide layer 34 from being over-etched when in the sidewall etching process. As illustrated in FIG. 3, however, if the same prior art technology is employed, the nitrified oxide layer 42 is provided also on the gate oxide layer 40, and therefore the thickness of the gate oxide layer 40 is controlled with difficulty, which might lead to a possibility of making control of a performance of the device difficult.

Under such circumstances, Japanese Patent Laid-Open Publication No.4-100243 also discloses such a technique that a nitride oxide layer 42' is, as shown in FIG. 4, formed only on the field oxide 34 and on a boundary between the field oxide 34 and the gate oxide layer 40. Thus, if the nitrified oxide layer 42 is formed on only a part of the surface of the gate oxide layer 40 as well as on a part of the surface of the field oxide layer 34, the thickness of the gate oxide layer 40 under the gate 35 remains unchanged, and hence the problem given above must be obviated.

In order to form the nitride oxide layer 42' on the partial area of the oxide layer, however, after the nitride oxide layer has been formed over the entire surface of the gate oxide layer 40, the nitride oxide layer under the gate 35 must be removed by use of a photolithography process, which conduces to a problem of increasing the number of working processes.

SUMMARY OF THE INVENTION

Under such circumstances, it is a primary object of the present invention to provide a manufacturing method capable of easily manufacturing a semiconductor device exhibiting a high reliability but no decrease in a field isolation voltage due to an influence by overetching.

To accomplish the above object, according to the present invention, a method of manufacturing a semiconductor device including a field oxide on a silicon substrate comprises a) a step of forming an oxidation proof layer including an aperture on the silicon substrate, b) a step of forming a field oxide for the device isolation by thermally oxidizing silicon at the aperture, c) a step of depositing a protective layer thicker than a thickness of the oxidation proof layer on the oxidation proof layer and on the field oxide layer, the protective layer being composed of such a selective removable material as to establish a condition under which the oxidation proof layer is selectively removed, d) a step of making the protective layer residual on only the surface of the field oxide by removing a part of the protective layer deposited in the depositing step till the surface of the oxidation proof layer is exposed, and e) a step of removing the oxidation proof layer.

To be more specific, according to the method of manufacturing the semiconductor device of the present invention, to start with, a protective layer is deposited on the surface of a field oxide formed by the LOCOS method and on the surface of an oxidation proof layer (a silicon nitride layer) formed to selectively oxidize silicon at a region in which to form this field oxide. Then, the oxidation proof layer is exposed by removing a portion of the protective layer, so that the protective layer remains on only the field oxide. Owing to this protective layer, the field oxide layer can be prevented from being etched when in an overetching process, and hence it is feasible to prevent an increase of leakage current, with which decreases in the field isolation voltage is concomitant. Besides, in the step of forming the protective layer, there is no necessity for using a resist mask etc, and therefore the protective layer can be easily formed. Further, since this protective layer is formed on only the surface of the field oxide layer, there is no possibility of exerting an influence upon a performance of the device.

Note that the protective layer may, when the semiconductor device is manufactured by the manufacturing method of the present invention, involve the use of any kinds of materials capable of establishing such an etching condition that only the oxidation proof layer is selectively removed in a posterior oxidation proof layer removing step. Specifically, polysilicon may be used.

Moreover, the step of removing a part of the protective layer may be executed by polishing the protective layer or by etching. In this step, if the protective layer is polished by use of CMP (Chemical Mechanical Polishing), the polishing process can be stopped at a stage where the surface of the oxidation proof layer is exposed, and hence the part of the protective layer can be efficiently removed.

Moreover, according to the present invention, there is provided a semiconductor device comprising a field oxide layer for the device isolation, and a layer formed on the surface of the field oxide, the layer being composed of such a selective removable material as to establish a condition under which a silicon nitride layer is selectively removed. Further, according to the present invention, there is provided a semiconductor device in which the selective removable material is polysilicon.

BRIEF DESCRIPTION OF THE DRAWINGS

Other objects and advantages of the present invention will become apparent during the following discussion in conjunction with the accompanying drawings, in which.

DETAILED DESCRIPTION OF THE PREFERRED EMBODIMENT

An embodiment of the present invention will be specifically described with reference to the accompanying drawings.

Figure 1:
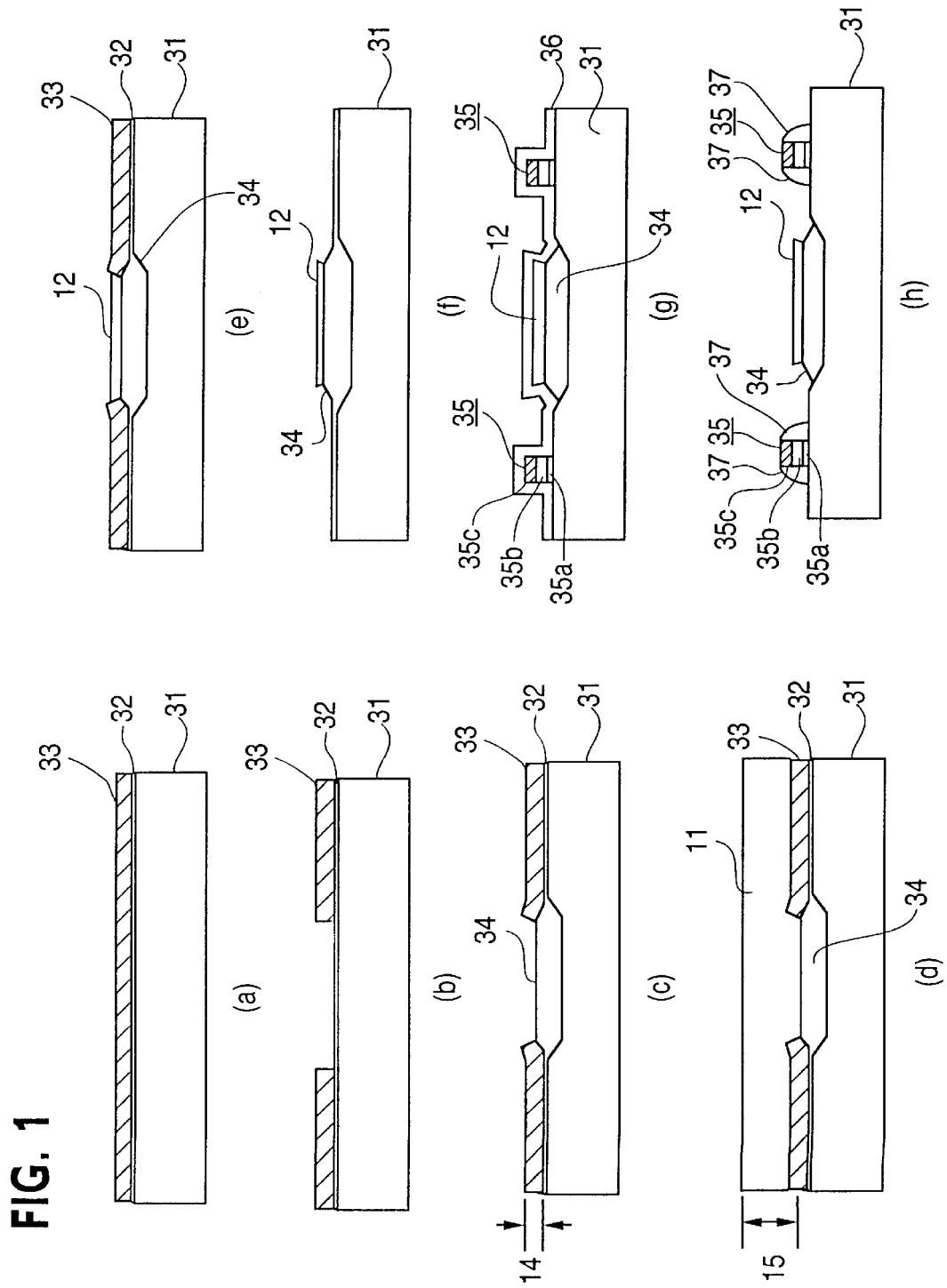
FIG. 1 is a diagram showing processes in a method of manufacturing a semiconductor device in an embodiment of the present invention.
Figure 2:
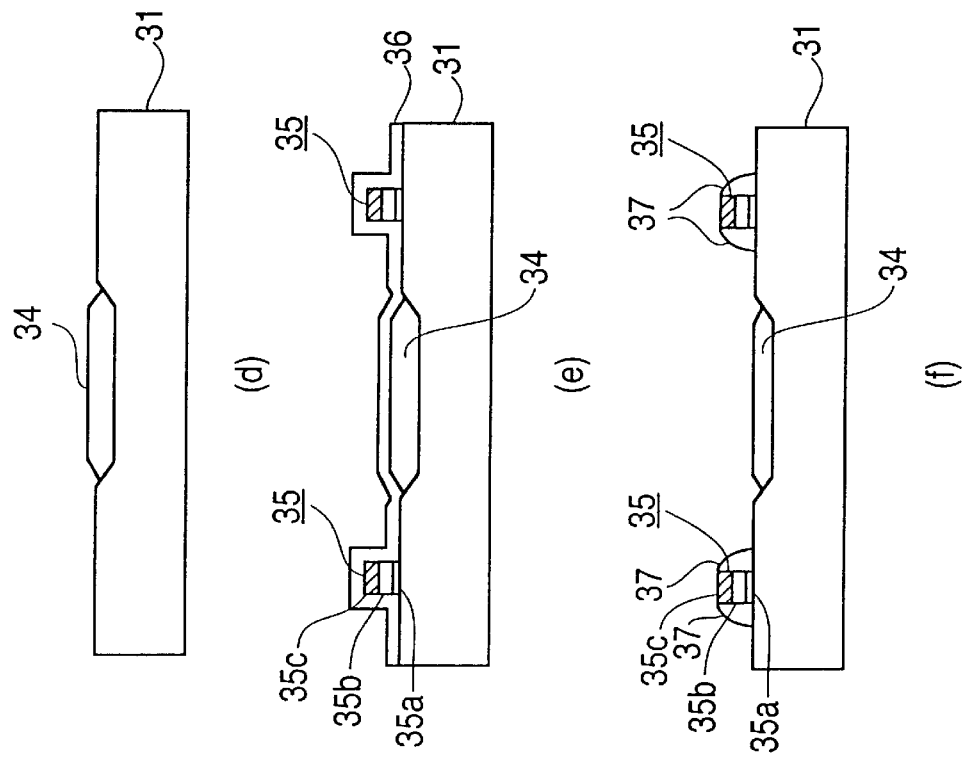
FIG. 2 is a diagram showing processes in a prior art method of manufacturing the semiconductor device.
Figure 2:
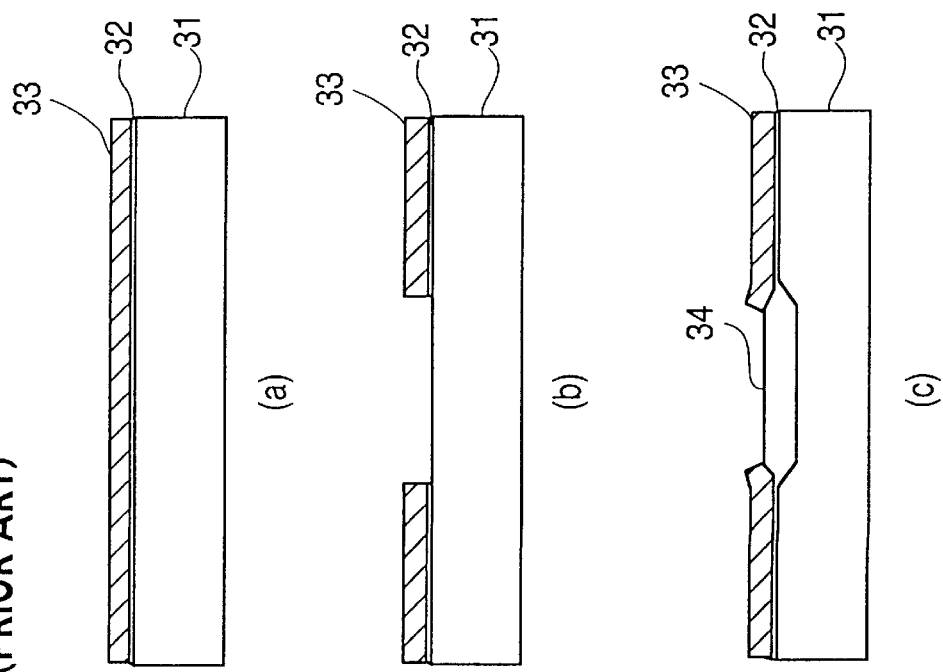
Figure 3:
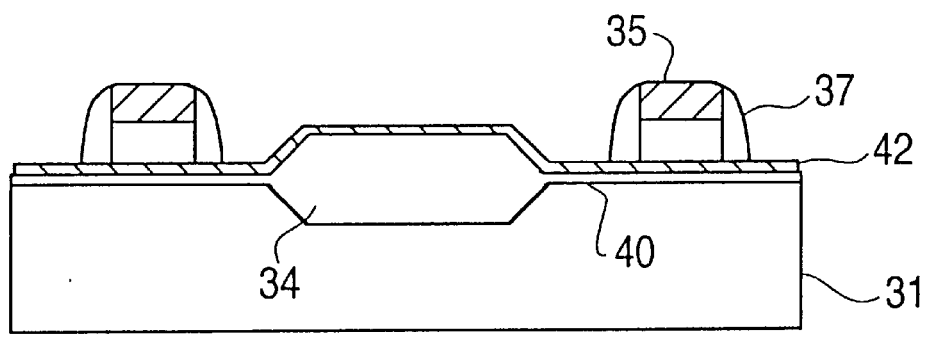
FIG. 3 is a sectional view illustrating a structure of the semiconductor device disclosed in Japanese Patent Laid-Open Publication No.4-100243.
Figure 4:
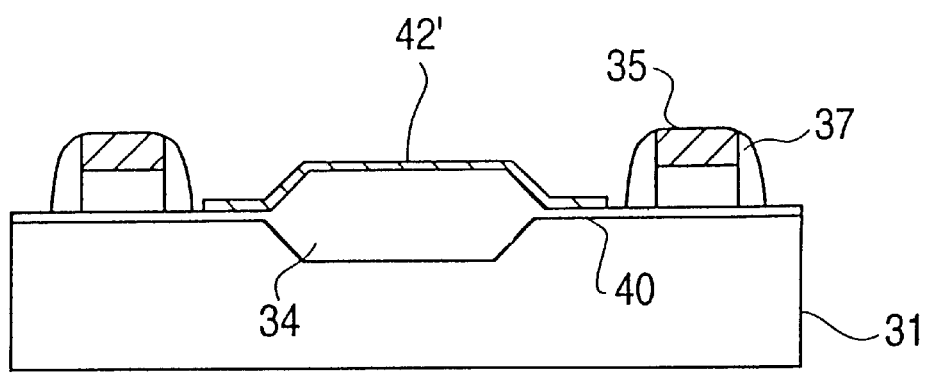
FIG. 4 is a sectional view illustrating the structure of the semiconductor device disclosed in Japanese Patent Laid-Open Publication No.4-100243.

FIG. 1 is a diagram showing processes in a method of manufacturing a semiconductor device in one embodiment of the present invention. First of all, a field oxide layer 34 is formed on a silicon substrate 31 by use of the LOCOS method as in the case of the prior art. More specifically, the surface of the silicon substrate 31 is thermally oxidized, whereby a silicon oxide layer 32 is formed in thickness of 15–20 nm on the silicon substrate 31. Subsequently, a silicon nitride layer 33 (an oxidation resisting layer) is deposited on the silicon substrate 31 by the CVD method. This nitride layer 33 has a thickness 14 on the order of 400–600 nm (FIG. 1(a)). Etched subsequently are the silicon oxide layer 32 and the silicon nitride layer 33 on a region in which to form a gate on the silicon substrate 31 by use of the photolithography. A structure including, as illustrated in FIG. 1(b), an aperture formed in a part of the silicon nitride layer 33 and in a part of the silicon oxide layer 32 on the silicon substrate 31, is thereby obtained. Then, ions are implanted into the silicon substrate 31 in order to prevent a parasitic transistor from being formed, and thereafter the silicon substrate 31 is wet-oxidized in an atmosphere containing water at approximately 1000° C., thereby forming a field oxide 34 having a thickness of about 1 μm (FIG. 1(c)).

Next, as shown in FIG. 1(d), a polysilicon layer 11 serving as a protective layer is deposited in thickness of 1 μm by the CVD method. At this time, the polysilicon layer 11 is deposited so that a thickness 15 of the polysilicon layer 11 is larger than the thickness 14 of the silicon nitride layer 33. This polysilicon layer 11 continues to be polished till the surface of the silicon nitride layer 33 becomes exposed by CMP (Chemical Mechanical Polishing) as shown in FIG. 1(e).

The CMP may be a technique for flattening a rugged portion on the surface, by which to flatten the surface by a mechanically cutting process using a chemical abrasive (slurry) and a polishing pad. One of characteristics of the CMP technique is that a region wider than that by another polishing techniques can be flattened, and this CMP technique is generally used for specular polishing of a silicon wafer. The CMP technique is capable of polishing a variety of substances by combining abrasive grains with chemically active solvent. When the polysilicon layer 11 is polished by the CMP, there must be effected polishing as a combination of chemical polishing based on alkali with mechanical polishing based on silica by use of abrasive in which colloidal silica is dispersed in strong alkali. The polysilicon layer 11 can be polished at a high polishing rate by such abrasive. Further, silicon nitride is chemically stable with respect to alkali and therefore, when using the above abrasive, it is low in terms of the polishing rate with respect to the silicon nitride layer 33. Accordingly, there must be a possibility in which the polishing process is decelerated or stopped at a stage of the surface of the silicon nitride layer 33 being exposed when the polysilicon layer 11 is polished. Namely, only the polysilicon layer 11 deposited thicker than the silicon nitride layer 33 can be efficiently removed by using the CMP.

Next, the silicon nitride layer 33 is removed by the wet chemical etching involving the use of phosphoric acid. The polysilicon layer 12 is stable with respect to phosphoric acid, and hence there is obtained a structure having the polysilicon layer 12 as the protective layer formed on only the field oxide layer 34 (FIG. 1(f)). Thereafter, the photolithography and the etching are carried out according to the normal semiconductor manufacturing process, and the gate oxide layer 35a, the polysilicon layer 35b for the gate electrode and the tungsten silicide 35c are formed on the active region, thereby forming the gate 35. Then, the oxide layer 36 for forming the side-wall is deposited over the entire surface of the substrate by the CVD method (FIG. 1(g)).

Thereafter, the side-wall 37 is formed by implementing the anisotropic etching such as the RIE with respect to the oxide layer 36 (FIG. 1(h)). Then, the insulating layer and the contact hole are formed, and the aluminum wiring is conducted by the normal processes, thus completing the MOSFET.

Herein, as discussed above, since there are non-uniformities in the thickness of the oxide layer 36 deposited by the CVD method and in the etching speed of the anisotropic etching, the overetching is conducted to completely remove the oxide layer 36 on the gate 35 as well as on the silicon substrate 31. In accordance with this embodiment, however, the field oxide layer 34 is protected by the polysilicon layer 12, and therefore, even when the oxide layer 36 is overetched, it never happens that the field oxide layer 34 is etched. Accordingly, it is possible to prevent the problem in terms of the decrease in the field isolation voltage which is caused due to the field oxide layer 34 becoming thinned. Besides, in accordance with this embodiment, the polysilicon layer 12 can be formed in a self-matching manner on only the field oxide layer 34, and, this eliminating the necessity for using a mask etc, the polysilicon layer 12 can be easily formed.

Note that the method of forming each layer or the thickness of each layer for manufacturing the MOSFET is not limited to those described above. Further, although this embodiment has exemplified the method of manufacturing the MOSFET, the manufacturing method according to the present invention can be applied to manufacturing the other kinds of semiconductor devices.

Moreover, in the present embodiment, the polysilicon layer 11 serving as the protective layer is formed on the field oxide layer 34, however, other materials are usable without being confined to polysilicon. On such an occasion, in a posterior process of removing the silicon nitride layer 33, it is required that the etching be executed under such a condition that the silicon nitride layer 33 can be selectively removed.

Furthermore, in a process of removing the protective layer, other polishing methods without being limited to the CMP may be employed as a method of removing the protective layer. Further, the removal thereof can be done by the etching. In the case of removing a part of the protective layer by the etching, it is required that the conditions of an etching time etc be controlled so as to stop the etching process just when the surface of the silicon nitride layer is exposed.

This invention being thus described, it will be obvious that the same may be varied in same ways. Such variations are not to be regarded as a departure from the spirit and scope of the invention, and all such modifications as would be obvious to one skilled in the art are intended to be included within the scope of the following claims.

What is claimed is:

1. A method of manufacturing a semiconductor device, comprising:
   forming an oxidation proof layer including an aperture on a silicon substrate;
   forming a field oxide for device isolation in the aperture;
   depositing a protective layer thicker than a thickness of said oxidation proof layer on said oxidation proof layer and on said field oxide, said protective layer being composed of a selectively removable material capable of establishing a condition under which said oxidation proof layer and said field oxide are selectively removable;
   making said protective layer residual on only a surface of said field oxide by removing a part of said protective layer deposited during said depositing, until a surface of said oxidation proof layer is exposed;
   removing said oxidation proof layer;
   forming a gate of a transistor on a surface of said silicon substrate;
   depositing an oxide layer on said silicon substrate, said gate and said residual protective layer;
   etching said oxide layer until a surface of said residual protective layer is exposed and a side-wall of said oxide layer is formed on said gate;
   forming an insulating layer on the semiconductor device, said insulating layer having a contact hole formed therethrough; and
   connecting a wire to said gate through said contact hole, said protective layer being a material different than said oxide layer.

2. The method of manufacturing a semiconductor device according to claim 1, wherein said protective layer is composed of polysilicon.

3. The method of manufacturing a semiconductor device according to claim 1, wherein said removing the part of said protective layer comprises chemical mechanical polishing.

4. The method of manufacturing a semiconductor device according to claim 2, wherein said removing the part of said protective layer comprises chemical mechanical polishing.

5. A method of manufacturing a semiconductor device, comprising:
   forming an oxidation proof layer including an aperture on a silicon substrate;
   forming a field oxide for device isolation in the aperture;
   depositing a polysilicon layer thicker than a thickness of said oxidation proof layer on said oxidation proof layer and said field oxide, said polysilicon layer being a selectively removable material capable of establishing a condition under which said oxidation proof layer is selectively removed;
   making said polysilicon layer residual on only a surface of said field oxide by removing a part of said polysilicon layer deposited during said depositing, until a surface of said oxidation proof layer is exposed;
   removing said oxidation proof layer;
   forming a gate of a transistor on a surface of said substrate;
   making an oxide layer on said residual polysilicon layer, said gate and said substrate;
   removing said oxide layer until a surface of said residual polysilicon layer is exposed and a side-wall of said oxide layer is formed on said gate;
   forming an insulating layer on the semiconductor device, said insulating layer having a contact hole formed therethough; and connecting a wire to said gate through said contact hole.

6. The method of manufacturing a semiconductor device according to claim 5, wherein said removing the part of said polysilicon layer comprises chemical mechanical polishing.

7. A method of manufacturing a semiconductor device comprising:

forming an oxidation resisting layer with an aperture therein on a substrate;

forming a field oxide within the aperture;

depositing a protective layer on the oxidation resisting layer and the field oxide, the protective layer having a thickness greater than a thickness of the oxidation resisting layer;

removing a portion of the protective layer deposited on the oxidation resisting layer to expose the oxidation resisting layer and so that a residual portion of the protective layer remains on the field oxide within the aperture, the protective layer and the field oxide comprising materials having respectively different removal rates;

removing the oxidation resisting layer;

forming a gate on a surface of an active region of the substrate;

forming an oxide layer on the substrate, the gate and the protective layer;

removing the oxide layer until a surface of the protective layer is exposed and side-walls of the oxide layer are formed on the gate;

forming an insulating layer on the semiconductor device, the insulating layer having a contact hole formed therethrough; and connecting a wire to the gate through the contact hole, the protective layer being a material difference than the oxide layer.

8. The method of manufacturing a semiconductor device of claim 7, wherein said removing the oxide layer comprises etching.

9. The method of manufacturing a semiconductor device of claim 7, wherein said removing a portion of the protective layer comprises chemical mechanical polishing of the protective layer, the oxidation resisting layer having a relatively higher resistance to polishing than the protective layer.

10. The method of manufacturing a semiconductor device of claim 7, wherein the substrate is silicon and the protective layer is polysilicon.

* * * * *